(12) United States Patent
Moritz et al.

(10) Patent No.: US 6,717,412 B1
(45) Date of Patent: Apr. 6, 2004

(54) IGNITION SIGNAL PICKUP INTERFACE BOX

(75) Inventors: Tyrone J. Moritz, Lincolnshire, IL (US); Michael Meeker, Lincolnshire, IL (US); Thomas D. Loewe, Wonder Lake, IL (US)

(73) Assignee: Snap-On Technologies, Inc., Lincolnshire, IL (US)

( * ) Notice: Subject to any disclaimer, the term of this patent is extended or adjusted under 35 U.S.C. 154(b) by 105 days.

(21) Appl. No.: 09/667,574

(22) Filed: Sep. 22, 2000

Related U.S. Application Data
(60) Provisional application No. 60/155,664, filed on Sep. 24, 1999.

(51) Int. Cl.$^7$ .............................. G01R 1/04; F02B 17/00
(52) U.S. Cl. ................................ 324/380; 324/402
(58) Field of Search ............................ 324/380, 391, 324/393, 402, 658

(56) References Cited

U.S. PATENT DOCUMENTS

| | | | |
|---|---|---|---|
| 3,502,884 A | 3/1970 | Periman et al. ............ 250/214.1 |
| 3,793,583 A | * 2/1974 | Glomski et al. ............ 324/121 R |
| 3,798,541 A | 3/1974 | Campbell, et al. ............ 324/72.5 |
| 3,959,725 A | 5/1976 | Capek ............................ 324/379 |
| 4,005,356 A | 1/1977 | Trussell |
| 4,052,665 A | 10/1977 | Gruenwald |
| 4,090,130 A | 5/1978 | Willenbecher, Jr. |
| 4,366,436 A | 12/1982 | Everett et al. |
| 4,396,888 A | 8/1983 | Everett et al. |
| 4,418,388 A | * 11/1983 | Allgor et al. ................. 700/74 |
| 4,490,677 A | 12/1984 | Risner ........................... 324/388 |
| 4,490,799 A | 12/1984 | Marino et al. |
| 4,708,121 A | 11/1987 | Everett et al. |
| 4,742,306 A | 5/1988 | Everett et al. |
| 4,758,790 A | 7/1988 | Hunt |
| 4,758,791 A | 7/1988 | Tedeschi et al. |
| 4,804,921 A | * 2/1989 | Putrow et al. ............ 324/103 P |
| 4,847,563 A | 7/1989 | Sniegowski et al. |
| 4,937,527 A | * 6/1990 | Sniegowski et al. ......... 324/379 |
| 5,004,984 A | 4/1991 | Becker et al. ............... 324/402 |
| 5,027,073 A | 6/1991 | Kaller et al. |
| 5,068,613 A | 11/1991 | Kreft et al. |
| 5,106,293 A | 4/1992 | Hawkins ........................ 431/2 |
| 5,111,790 A | 5/1992 | Grandy ........................ 123/406 |
| 5,132,625 A | 7/1992 | Shaland |
| 5,208,541 A | 5/1993 | Yerkovich et al. .......... 324/395 |
| 5,218,302 A | 6/1993 | Loewe et al. |
| 5,237,278 A | 8/1993 | Bumen |
| 5,334,938 A | 8/1994 | Kugler et al. |
| 5,355,056 A | 10/1994 | Miyata et al. |
| 5,363,046 A | 11/1994 | Shimasaki et al. |
| 5,365,910 A | 11/1994 | Miyata et al. |
| 5,376,886 A | 12/1994 | Shimasaki et al. .......... 324/402 |
| 5,387,870 A | 2/1995 | Knapp et al. |
| 5,391,100 A | 2/1995 | Maruyama et al. ............. 445/7 |
| 5,419,300 A | 5/1995 | Maruyama et al. .......... 123/634 |
| 5,444,376 A | 8/1995 | Dittmann et al. |
| 5,481,193 A | 1/1996 | Mueller et al. |
| 5,487,676 A | 1/1996 | Maruyama et al. |
| 5,493,496 A | 2/1996 | James et al. |
| 5,497,756 A | 3/1996 | Matthiesen et al. |

(List continued on next page.)

OTHER PUBLICATIONS

Physics for Scientist and Engineering, Third edition (1992) pp. 710–712.*
Electromagnetics, second edition 1995, pp. 251–252.*

*Primary Examiner*—N. Le
*Assistant Examiner*—Vincent Q. Nguyen
(74) *Attorney, Agent, or Firm*—McDermott, Will & Emery

(57) ABSTRACT

Method and apparatus for displaying ignition coil waveforms. The method includes disposing a plurality of capacitive elements adjacent a plurality of coil-over-plug ignition coils. Signals detected by the capacitive elements are supplied to an adapter in which signal gain, polarity, and range are selected according to a particular vehicle tested, and displayed.

11 Claims, 12 Drawing Sheets

U.S. PATENT DOCUMENTS

| | | |
|---|---|---|
| 5,508,618 A | 4/1996 | Owens |
| 5,561,379 A | 10/1996 | Downey |
| 5,634,828 A | 6/1997 | Stanley |
| 5,677,632 A | 10/1997 | Meeker |
| 5,742,276 A | 4/1998 | Taraki |
| 5,828,217 A | 10/1998 | Inagaki et al. |
| 5,834,939 A | 11/1998 | Makhija |
| 5,933,317 A | 8/1999 | Moncrieff ................... 361/311 |
| 6,009,360 A | 12/1999 | Knapp |
| 6,011,457 A | 1/2000 | Sakamaki et al. |
| 6,396,277 B1 | 5/2002 | Fong et al. ................. 324/402 |

* cited by examiner

IGNITION SIGNAL PICKUP INTERFACE BOX

CROSS-REFERENCE TO PROVISIONAL APPLICATION

This application claims priority from U.S. provisional patent application Ser. No. 60/155,664 filed Sep. 24, 1999, the entire disclosure of which is incorporated herein by reference.

FIELD OF THE INVENTION

The invention relates to engine analyzers for internal combustion engine direct ignition systems and, more particularly, to engine analyzers employing ignition signal pickups to detect ignition waveforms in direct ignition systems. The invention has particular applicability to automotive engine analysis in which ignition waveforms are displayed for technician evaluation.

BACKGROUND OF THE INVENTION

Engine analyzers provide mechanics with a tool for accurately checking the performance of the ignition system as a measure of the overall engine performance. Signal detectors ("test probes") are widely used in diagnosing defects and anomalies in internal combustion engines. A test probe is, for example, placed adjacent a test point such as a ignition coil, and the test probe communicates the signal back to a motor vehicle diagnostic apparatus. Information obtained from the test probe, such as spark plug firing voltage and duration, can help a mechanic determine if a spark plug associated with the ignition coil is functioning properly.

FIGS. 1a and 1b illustrate, respectively, the relationship between a typical primary ignition waveform and secondary ignition waveform as a function of time. The waveforms have three basic sections labeled Firing Section, Intermediate Section, and Dwell Section. Common reference numerals are used in FIGS. 1a and 1b to represent common events occurring in both the primary and secondary waveforms. As shown in FIGS. 1a and 1b, at the start S of the waveform, no current flows in the primary ignition circuit. Battery or charging system voltage available at this point is approximately 12–15 volts. At 10, the primary switching device turns on the primary current to start the "dwell" period. At 20, current flows through the primary circuit, establishing a magnetic field in the ignition coil windings. A rise in voltage occurs along 30 indicating that coil saturation is occurring and, on ignition systems that use coil saturation to control coil current, a current hump or voltage ripple appears at this time. The part of the waveform representing primary circuit on-time is between points 10 and 40. Thus, the portion of the signal between points 10 and 40 represents the dwell period (cam angle on breaker point ignition systems) or "on-time" of the ignition coil primary current.

The primary switching device stops the primary current flow at 40, suddenly causing the magnetic field that had built up to collapse and induce a high voltage in the primary winding by self-induction. An even higher voltage is induced, by mutual induction, into the secondary winding, because of a typical 1:100 primary to secondary turns ratio. The secondary voltage overcomes the resistances in the secondary circuit up to the spark plug gap. The spark plug gap is ionized and current arcs across the electrodes to produce a spark 50 (i.e., the "firing line") to initiate combustion. During the "spark line" 60, the actual discharge voltage across the air gap between spark plug electrodes is reduced until the coil energy is no longer able to sustain the spark across the electrodes (see e.g., 70). At 80, an oscillating voltage results. Oscillations in the primary circuit occur until, at 90, the coil energy is dissipated and there is no current flow in the primary circuit.

In early ignition systems, such as the ignition system for a four cylinder engine illustrated in FIG. 2, a single ignition coil 120 is connected to one spark plug (e.g., 150) at a time by a distributor 130. Ignition coil 120 is essentially a transformer which transforms the low voltage in the primary winding provided by battery 100 to a high voltage in the secondary winding. The high voltage current pulses generated in the secondary winding are routed to distributor 130, which selectively routes the high voltage pulses to selected spark plugs (e.g., 150). As is well known, at each cylinder, the resulting electric discharge between the spark plug electrodes produces a spark which ignites a fuel-air mixture drawn or forced into the cylinder and compressed to an explosive state, thereby driving a piston in the cylinder to provide power to an attached crankshaft. Analysis of ignition waveforms to evaluate engine performance is performed by capacitively coupling a waveform signal pickup 140 to the coil 120 or a spark plug wire, for example.

More recently, ignition systems have evolved to one coil per cylinder, and may not have any spark plug wire at all. So called "direct ignitions" incorporate an ignition coil over each plug or an ignition coil near each plug. In "cassette type" spark ignition systems, the ignition coils are disposed directly over the cylinders. An example of a direct ignition coil is shown in FIG. 3. High voltage generated at the secondary coil 340 by means of the primary coil 320 and magnetic core 300 is routed through the output 330 of the secondary coil to conductive shaft 360 and to the spark plug 380. Thus, there is one ignition coil per spark plug.

In general, there is a wide variation of ignition coil architecture, placement, and interconnection among different manufacturers and vendors. Accordingly, it is difficult to standardize a pickup for measuring ignition waveform and it is often necessary to obtain different clip-on arrangements for coupling the pickup to a coil for different manufacturers. There are approximately 26 styles of coils for direct ignition systems used by 19 vehicle manufacturers. This variation in ignition coil architecture, placement, and interconnection among manufacturers results in significant variations in ignition output waveforms and signal intensities. Signal analysis is further complicated by use of after-market coils, which may exhibit stronger or weaker signals than OEM coils. Presently, secondary ignition coil waveform analysis is performed using a multitude of secondary ignition coil testers often configured for specific makes and models of automobile engines.

Correspondingly, a method and apparatus to measure and display ignition coil waveforms, particularly secondary ignition coil waveforms, for a variety of makes and models of automobile engines is needed. A simplified set of testers is needed to reduce the arsenal of testers currently required down to a manageable number of essentially universal ignition waveform pickups. An electronic circuit interface between the simplified set of testers and an engine analyzer and display device, such as a Sun machine version 4.0 is also desired to condition and amplitude normalize the waveforms. In this respect, commonly used handheld electronic diagnostic device provide only a histograph or other simplified representative of selected sample points, such as a sampling of the maximum voltage per revolution of the engine, and are not suitable for complete waveform analysis.

SUMMARY OF THE INVENTION

In one aspect, a coil-over-plug testing adapter system for use in combination with an engine analyzer is implemented with a capacitive pickup probe. The adapter system also includes an input port arranged to receive a signal provided by the capacitive pickup probe when placed in proximity to a coil-over-plug or coil-near-plug ignition assembly under test and a gain controller configured to modify a signal developed at the input port selectively by amplification and/or attenuation. A trigger pickup is arranged to provide, if needed, a timing signal from the coil-over-plug or coil-near-plug assembly to the engine analyzer. An output port is arranged to output the signal modified by the gain controller to the engine analyzer.

In another aspect, a method of displaying ignition coil waveforms includes disposing a plurality of capacitive elements adjacent a plurality of coil-over-plug ignition coils and selecting on an adapter electrically connected to the capacitive elements at least one of a predetermined gain, polarity, and range according to a vehicle under test. Ignition coil signals are measured and transmitted to the adapter, where they are conditioned according to the selected predetermined gain, polarity, and/or range are output from the adapter and displayed.

Yet another aspect provides a capacitive ignition coil probe comprising a substantially planar first conductive layer, a substantially planar second conductive layer, and a dielectric layer between the first conductive layer and second conductive layer. An insulating material laminates the first conductive layer, the second conductive layer and dielectric layer which form, in combination, an elongated flexible capacitive bar.

Still another aspect provides a capacitive ignition coil pickup set comprising a plurality of probes including a substantially planar first conductive layer and a substantially planar second conductive layer separated by a dielectric layer and laminated by an insulating material, a conductive path connecting the probes. Further included are a first connector at a distal end of the conductive path and a second connector at a proximal end of the conductive path. The probes are spaced apart from one another a predetermined distance along the conductive path and a distance between each of the first connector and second conductor to a respective adjacent probe is approximately one-half the predetermined distance between adjacent probes.

Additional features and advantages of the invention will become readily apparent to those skilled in the art from the following detailed description, wherein only several embodiments or applications of the invention are shown and described, simply by way of illustration of modes contemplated for carrying out the invention. As will be realized, the invention is capable of other and different embodiments, and its several details are capable of modifications in various obvious respects, all without departing from the invention. Accordingly, the drawings and description are illustrative in nature and are not limiting.

DESCRIPTION OF THE EMBODIMENTS

Figure 1A:
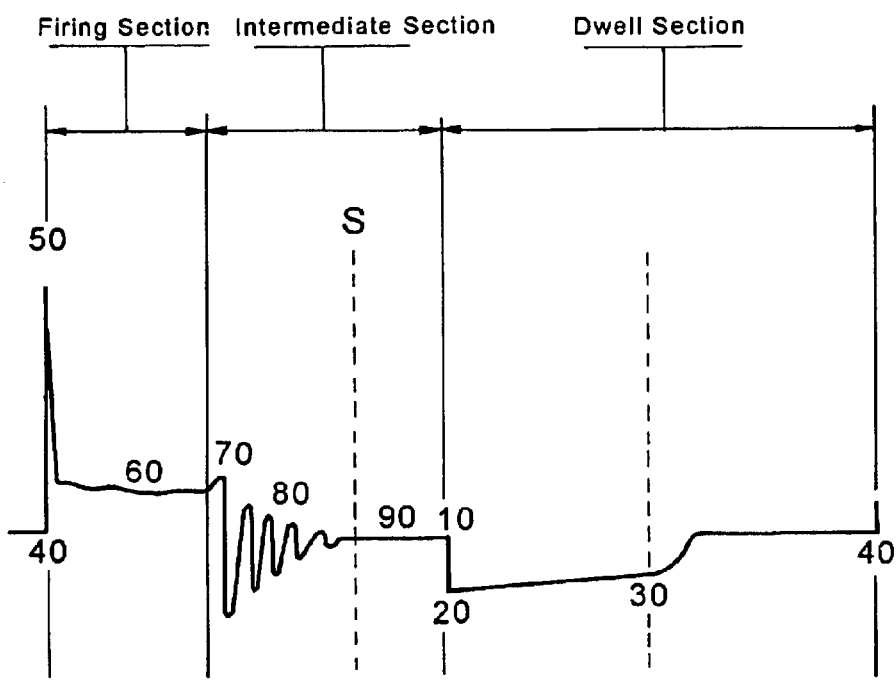
FIGS. 1a and 1b illustrate the relationships between typical primary and secondary ignition waveforms.
Figure 1B:
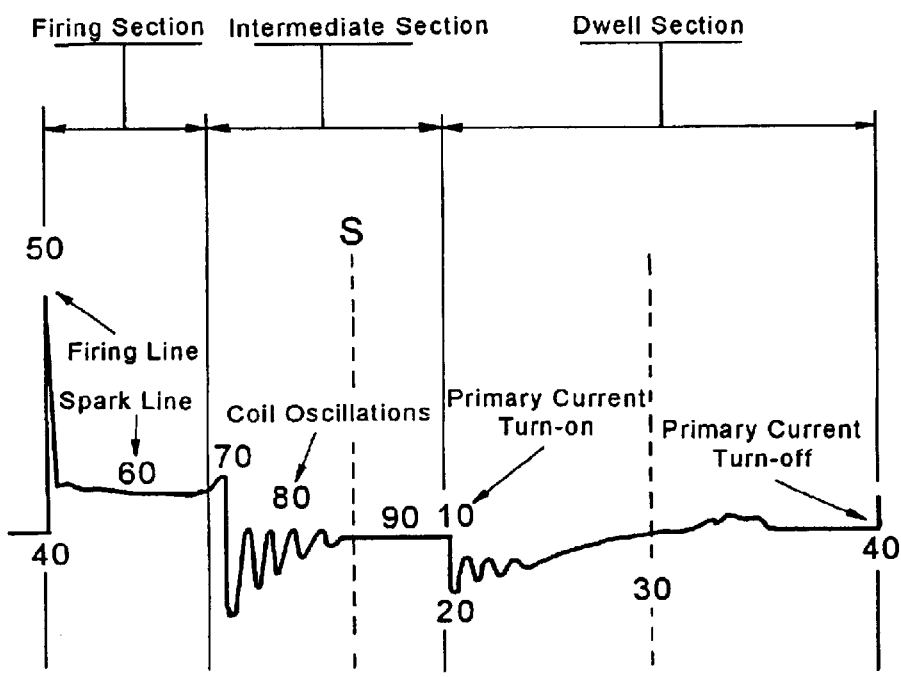
Figure 2:
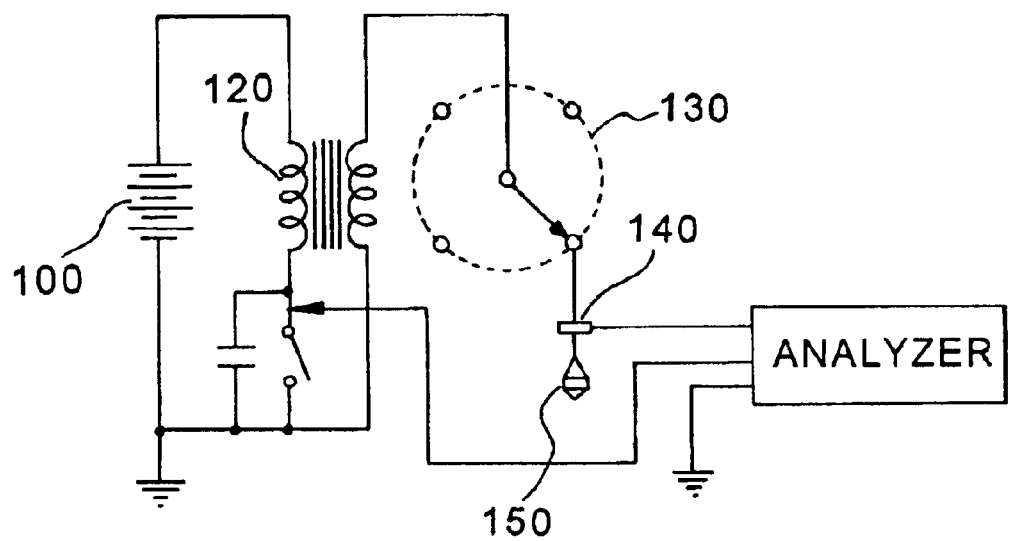
FIG. 2 shows a conventional ignition system using a distributor and a single ignition coil.
Figure 3:
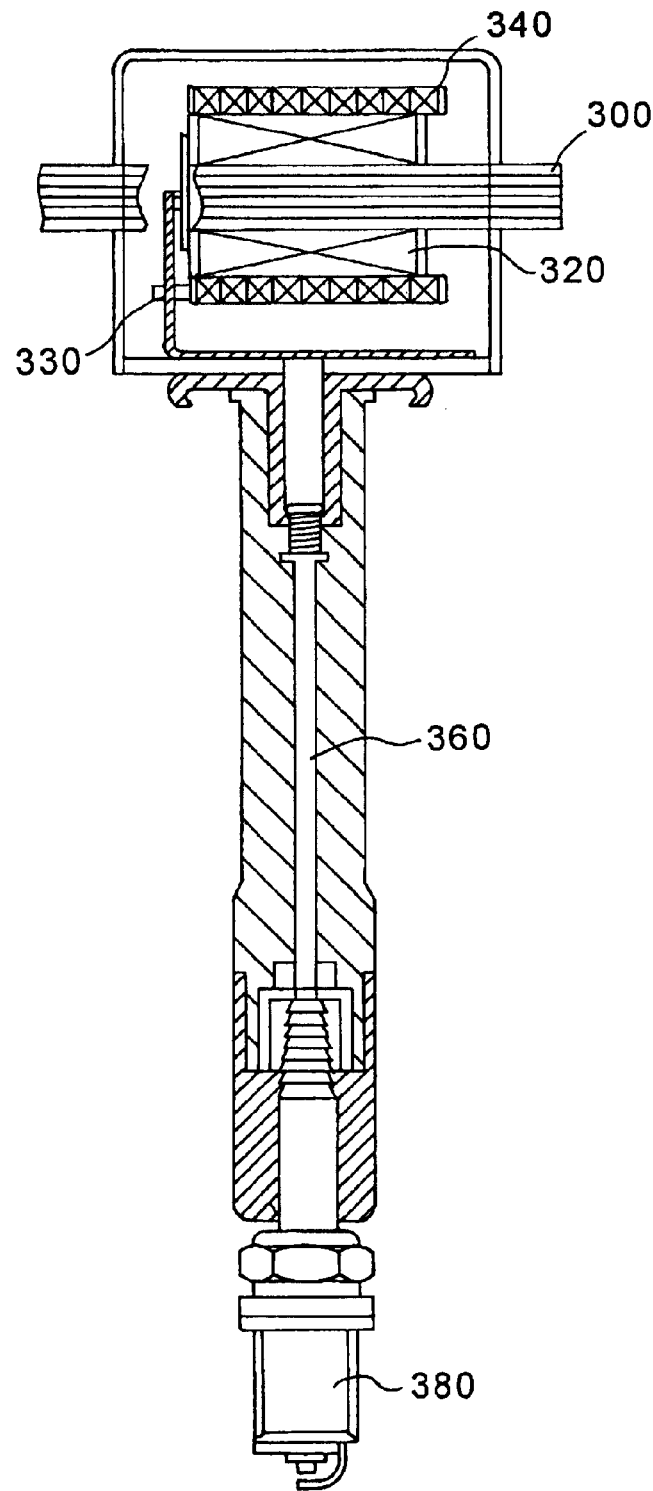
FIG. 3 shows an example of a "coil on plug" ignition coil.
Figure 4:
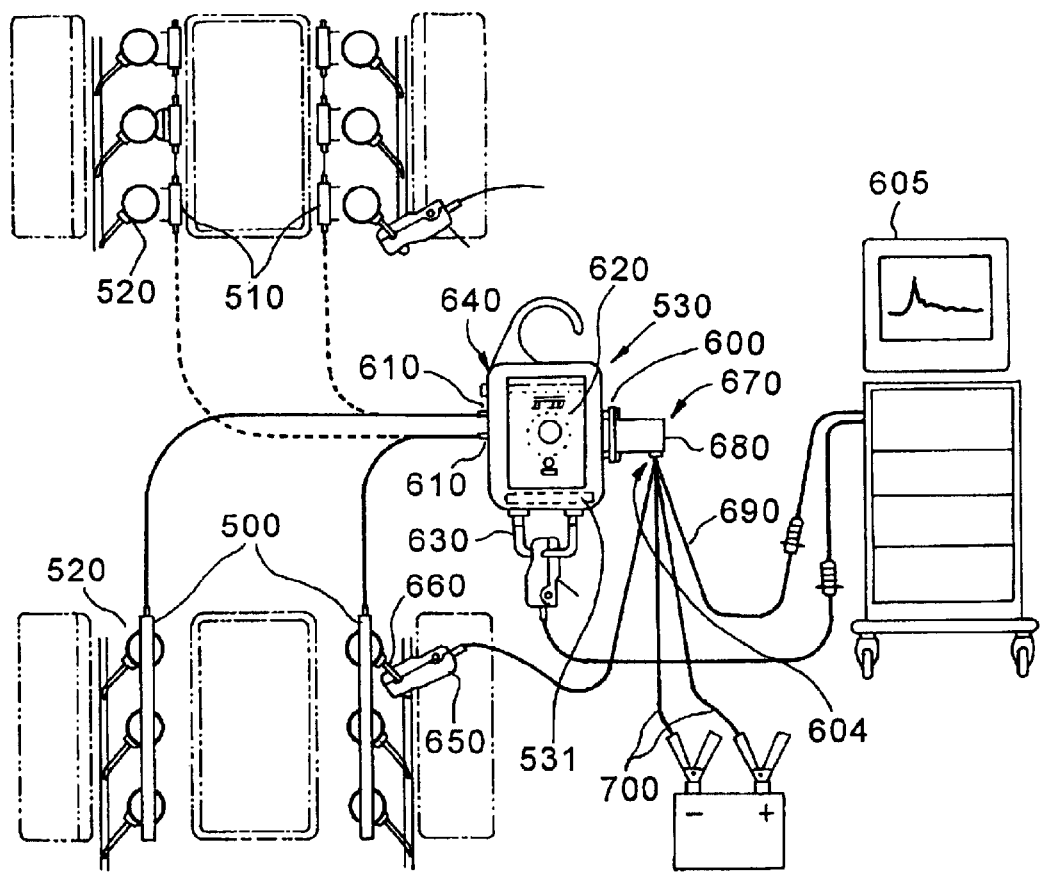
FIG. 4 shows an apparatus used to perform a method of displaying ignition coil waveforms according to the present invention.

FIG. 4 illustrates an apparatus used to perform a method of displaying measured ignition coil waveforms, particularly secondary ignition coil waveforms, in accord with the invention. The measured ignition coil signals may, in fact, reflect signal contributions from sources other than the secondary side coil, such as the primary side ignition coil. Such influences may be discriminated out, as desired.

The apparatus of the invention includes a coil-over-plug testing adapter 530 comprising an input port 610 and an output port, or lead assembly connector accessible by the technician and used to modify the magnitude of a measured signal, particularly the secondary aspect of the ignition coil waveform, input to the input port 610 from a measuring device, such as a capacitive element, two exemplary embodiments of which, 500, 510 termed a sensor "stick" and a sensor "flag", respectively, will be described in more detail below. The modified signal is output through the output port 600 to an engine analyzer 605 such as any commercially available Sun engine analyzer equipment. Although it is preferred that the input and output ports utilize RCA connection terminals, any data receiving connection may be used to receive data provided along any suitable data transmission path, such as high frequency carrier waves, for carrying data such as ignition coil waveform signals.

Adapter 530 conditions the ignition coil signals in accord with the selected predetermined parameters of gain and range, controlled manually by a technician implementing the gain control 620 and range control 640 depending on signal magnitudes produced by the ignition under test and detected by the inventive probe, to be described later, and the input range of the analyzer. Range control 640 may comprise a slide or other type switch that permits selection of, for example, a HIGH or LOW range which slightly overlap and correspond to about 0.01 pf to 0.3 pf and 0.10 pf to 3.0 pf, respectively. Additional increments may be provided to account for signals spanning more than two decades, as in the present embodiment. Gain control 620 may take the form of a gain adjust knob permitting gain adjustment within each of these ranges. This degree of signal amplification or attenuation may be correlated to a fixed scale on a outer surface of adapter 530, to simplify operation of the adapter. Adapter 530 also may include a polarity controller to normalize signals provided from ignition output signals having either a positive (reverse) polarity or a negative (normal) polarity. Of course, these are merely illustrative examples and other ranges and degrees of amplification are included within the concepts expressed herein.

Adapter 530 may optionally include a trigger output element such as a loop 630. The trigger output loop 630 is used in conjunction with trigger pickup 650 to be connected to, for example, the #1 coil primary wire 660. The trigger output loop 630 serves, for example, as a timing means for those engine analyzer systems not having enough sensitivity to be used on the low voltage primary. Also, since there are no secondary wires to connect to the cylinder #1 trigger, a stable source of cylinder #1 reference is needed. Adapter 530 provides a stable #1 cylinder signal when the trigger pickup is connected to the low voltage primary circuit of the coil, as shown in FIG. 4. However, many cylinder #1 trigger pickups do not detect a stable signal when connected directly to the primary circuit of a coil. Therefore, as shown in FIG. 5 and described below, adapter 530 advantageously provides an inductive pickup 650 connected to input port 604 to amplify a low voltage signal measured from the primary circuit to generate a pulse to be detected by an attached engine analyzer or computer.

Adapter harness assembly 670 includes a coil-over-plug adapter harness connector 680, a coil-over-plug pickup lead 690, battery leads 700, and optionally, the trigger pickup 650. Coil-over-plug adapter harness connector 680 detachably connects to lead assembly connector 600, providing a data path between adapter 530 and an engine analyzer. Alternatively, other data transmission paths between the adapter 530 and the engine analyzer may be used. Data transmission may include any medium able to bear data, such as light waves or other high frequency waves. Battery leads 700, such as alligator-type clamps, are connectable to battery leads to provide a desired voltage (e.g. 12V) to adapter 530, although other power sources and operating voltages may be used, such as a battery internal to the adapter 530.

Figure 5:
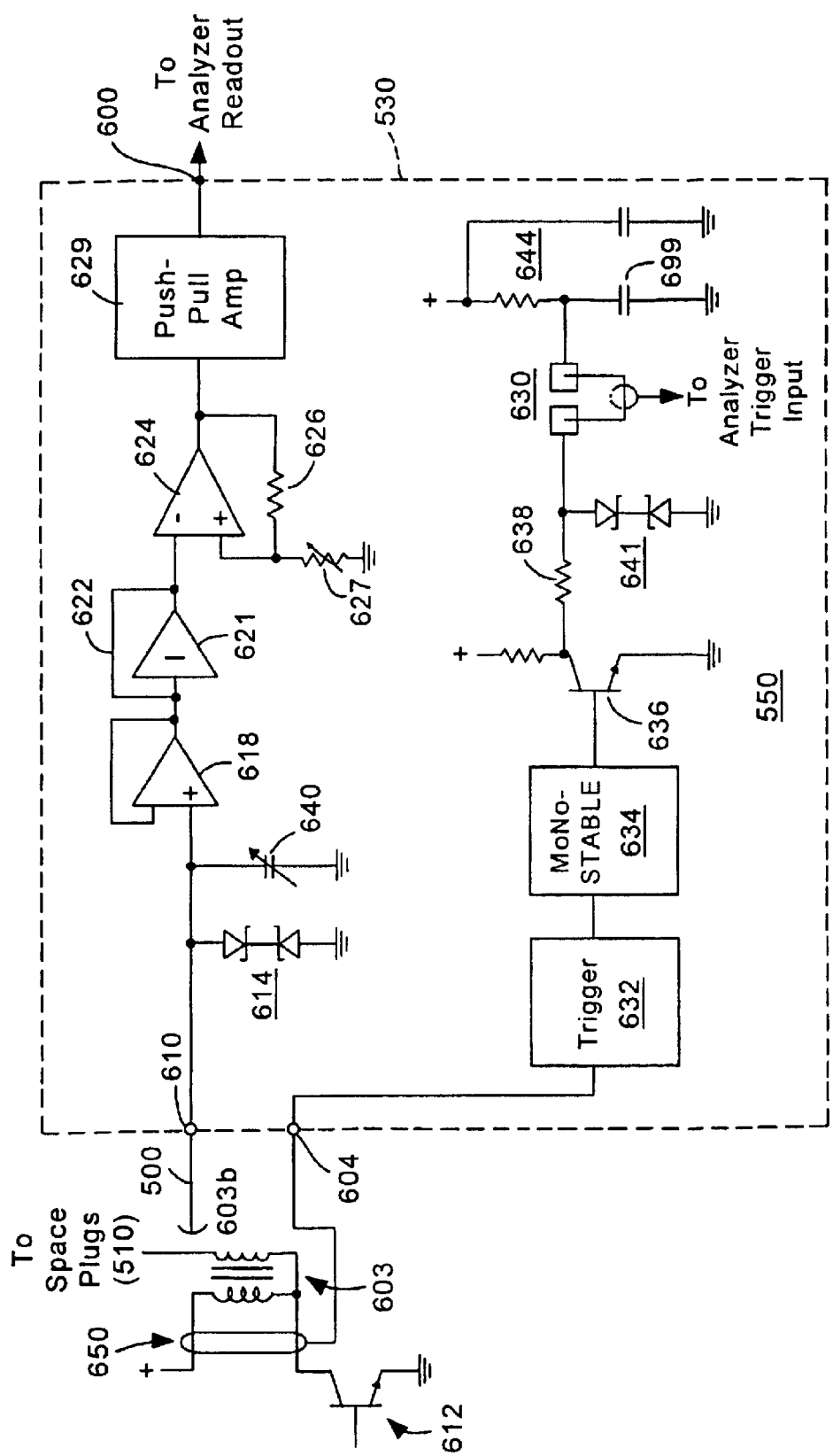
FIG. 5 is a schematic diagram of an adapter circuit implemented in an embodiment of the invention.

FIG. 5 is a diagram showing circuitry underlying adapter 530, in accord with the invention. The adapter 530 includes an internal power supply (not shown) producing (+) and ground potentials that may be in the form of an internal battery 531 (optionally rechargeable), a converter for converting alternating current obtained from an available line power source, or leads for connection to the battery of a vehicle under test as shown in FIG. 4. Signal outputs from the engine of the vehicle under test are provided at ports 610 and 604. The adapter further includes two outputs: a first output 600 that is adapted to be connected to the engine analyzer 605 for producing the desired display of information to be used by the technician for diagnosis, and trigger output 630 adapted to be coupled to the conventional trigger input terminal of the analyzer, such as by an inductive coupling The purpose of the trigger output to the analyzer is to synchronize operation of the analyzer to the ignition cycle of the vehicle under test, if the analyzer requires one. This is accomplished by producing a trigger signal that is synchronized to a prescribed spark plug ignition cable, typically the cylinder #1 cable. The manner by which these signals are produced and processed will now be described.

Shown to the left of adapter 530 in FIG. 5 is a portion of a spark-ignition system of the vehicle under test, including an ignition coil 603 having a primary winding 603a, one end of which is coupled to the power supply source. The opposite end of the primary winding is connected to a switching section of an ignition system, shown partially by switching transistor 612, which in some ignitions is performed by mechanical breaker points rather than a transistor. When the transistor is "ON", a current flows in the primary winding 603a inducing a magnetic field in the core of the coil 603. When the transistor 612 is "OFF" the primary current falls rapidly and the magnetic field collapses. This rapid collapse of magnetic field in the core induces a high voltage in the secondary winding 603b, that is applied to the spark plugs.

The ignition waveform, particularly the secondary aspect of the ignition waveform, is detected by a capacitive ignition coil probe, to be described in detail hereinafter, positioned in proximity to the plug coils. This probe, identified by the numeral 500 or 510 is connected to adapter 530 at input 610. Another input, connected at 604, is a trigger cable that is clipped by trigger pickup clamp 650 to the number one coil primary wires 660. As discussed in more detail below, the impulse from the primary leads by 650 is conditioned by adapter 530 and applied at output loop 630 to the trigger input of the analyzer equipment for synchronization to the ignition system of the vehicle under test.

The ignition signal developed at adapter input 610 is applied at an upper circuit branch of the adapter to the input of a voltage-follower or buffer 618. Connected between the input of buffer 618 and ground are a voltage protection circuit 614, implemented in the embodiment shown by a pair of oppositely poled Zener diodes, and an attenuation capacitor 640, which may be a variable capacitor, ganged in the illustrated embodiment, to form a voltage divider network with the capacitive pickup established by the capacitive ignition coil probe 500, 510. The attenuation capacitor 640 preferably is of a type that is ganged, so as to attenuate the signal produced by the sensor in precisely controlled, discrete amounts defining magnitude coarse ranges. Buffer 618 provides impedance isolation between capacitive probe 500, 510 and the components downstream of attenuation capacitor 640.

The signal sensed by probe 500, 510 is often, but not always, negative in polarity depending on automobile manufacturer. The polarity of the sensed signal optionally may be inverted by an inverter 621 selectively enabled or disabled by switch 622. The inverter 621 may be implemented by a conventional unity gain inverting operational amplifier, although other implementations are possible. As an alternative to switch 622, any conventional manner of selectively enabling the inverter, manually or automatically in response to signal polarity, may be used.

The sensed signal now is applied to the input of a variable gain operational amplifier 624, whose gain is controlled by a resistive divider network comprising resistors 626 and 627, configured in a conventional manner. Resistor 627 is variable and may be operative in a stepped or continuous manner to provide a fine magnitude adjustment for the sensed ignition signal. In the illustrated embodiment, operational amplifier 624 is configured by resistors 626, 627 to have a gain greater than unity and thereby amplify, in relatively fine increments, the signal previously attenuated, in relatively coarse increments, by attenuation capacitor 640. Hence, a combination of capacitive attenuator 640 and controlled gain operational amplifier 624 enables the sensed signal to be amplified or attenuated by precisely controlled amounts at the operator's discretion. Finally, the output of the amplifier 624 is applied to an output driver 629, that may be a transistor type push-pull amplifier, whose output is applied to the data input terminal of the analyzer.

Still referring to FIG. 5, the lower branch of the circuit of adapter 530 synchronizes the analyzer to the ignition system of the vehicle under test. Synchronization of the analyzer to the ignition is performed by clipping pickup 650 to the number one coil primary wires, to be conditioned and applied to the trigger input of the analyzer.

The signal detected by inductive pickup 650 is applied to a level sensitive trigger 632, such as a Schmitt trigger, which produces an output signal in response to a coil secondary current flowing through the primary side supply wire that exceeds a prescribed magnitude. This coil current corresponds to the spark event on the secondary side, as the two primary side lead signals cancel each other out due to the arrangement of inductive pickup 650 around both primary leads leaving only a resultant secondary current induced in the primary coil by the spark event and flowing through the primary leads back to the power supply. The prescribed magnitude of this coil current depends on a threshold voltage internal to the trigger or optionally provided externally, as is conventional. In response, a monostable multivibrator 634 produces a pulse of fixed duration during which any other input signals, such as noise, will be ignored. The output of monostable multivibrator 634 in turn is applied to control a switching transistor 636 that, when enabled (turned on) by the monostable multivibrator 634 pulses, dumps the charge from the capacitor 699 through resistor 638 and an output element 630 to ground, producing a detectable signal that is picked up by the trigger input of the analyzer, clipped for inductive detection to the element as shown in FIG. 4. Zener diodes 641 protect the circuits from external transient voltage fluctuations. When transistor 636 is controlled by a monostable multivibrator to turn off (disabled), current from the power supply charges capacitor 699 in preparation for the next primary signal event. Thus, the detectable signal picked up by the trigger input of the analyzer synchronizes the analyzer to the ignition system. Synchronization could be made to the ignition system alternatively to a plug wire other than the number one wire.

Figure 6A:
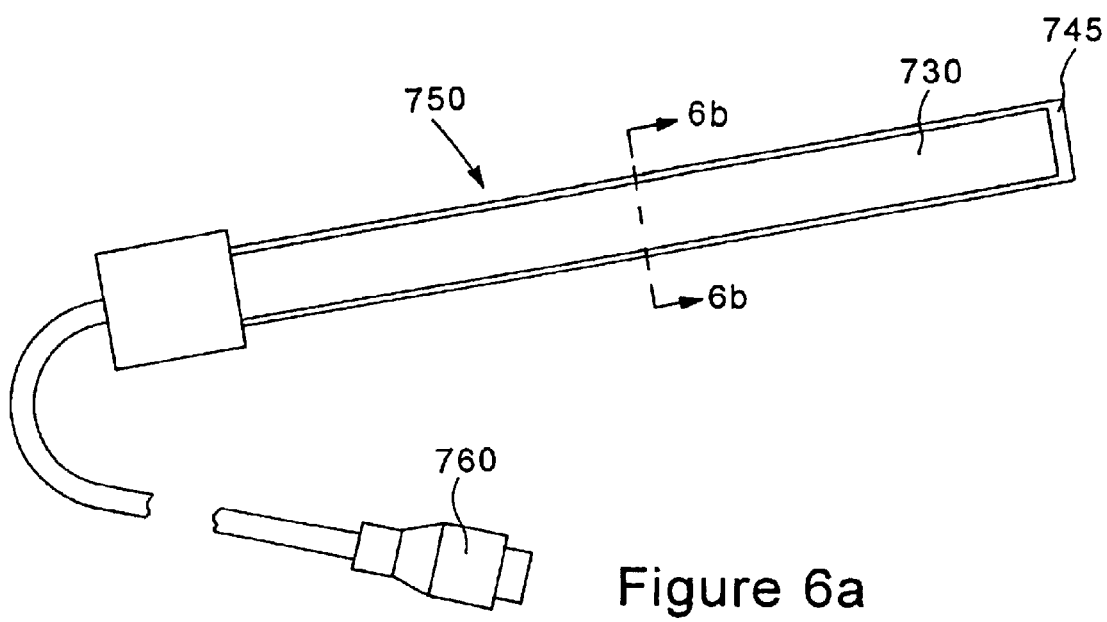
FIGS. 6a and 6b depict respectively a "stick"-type capacitive ignition coil probe and a cross-section thereof in accord with the invention.
Figure 6B:
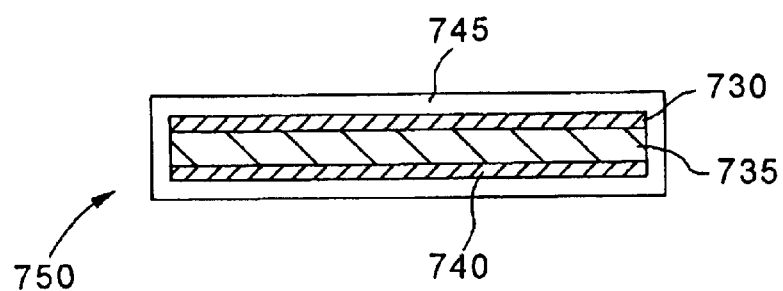

One embodiment of the capacitive ignition coil probe 500, 510 is the "stick" type probe designated 500 in FIG. 4, shown in more detail in FIG. 6a. This probe 500 includes a substantially planar first conductive layer 730 (see also FIG. 6b), a substantially planar second conductive layer 740, and a dielectric layer 735 between the first conductive layer and second conductive layer. An insulating material 745 laminates the first conductive layer 730, second conductive layer 740 and dielectric layer 735, which form, in combination, an elongated flexible capacitive bar 750. One conductive layer (e.g., first conductive layer 730) serves as a signal measurement layer to output a measured signal, whereas the other conductive layer (e.g., second conductive layer 740) serves as a ground or a shield layer to attenuate a signal received by the signal measurement layer, as discussed in more detail below. In such an elongated probe, it is desired that the probe have a length greater than or equal to at least ten times its width. For example, a preferred embodiment of "stick" probe has a length between approximately 14–16 inches and a width between approximately 0.25 inch to 1.00 inch. A connector 760, such as a male or female RCA plug, is provided at one end of the probe for transmission of signals from the probe to a connected component.

Figure 7A:
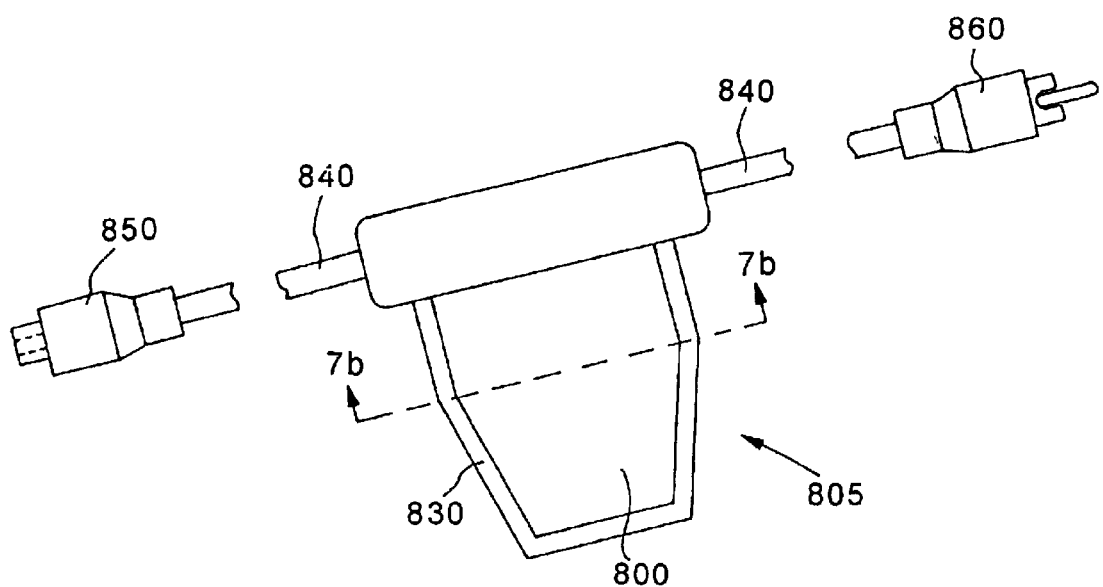
FIGS. 7a–7c are illustrations of inventive "flag"-type capacitive ignition coil probe, a cross section thereof, and connection of two strands of the "flag"-type capacitive ignition coil probes shown in FIG. 7a, respectively.
Figure 7B:
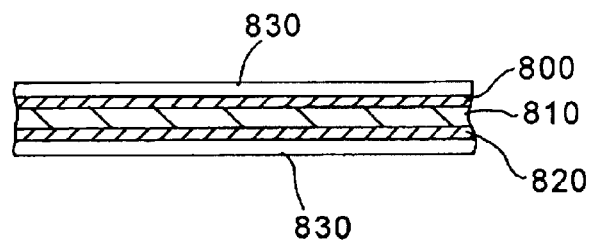

Another embodiment of the capacitive ignition coil probe, a "flag" type probe 805, designated as 510 in FIG. 4, is shown in FIG. 7a. This flag type probe includes a substantially planar first conductive layer 800 and a substantially planar second conductive layer 820 separated by a dielectric layer 810 and laminated by an insulating material 830, wherein a conductive path 840 connects the probes as represented in FIG. 7a. As noted above, one conductive layer serves as a signal measurement layer to output a measured signal, whereas the other conductive layer serves as a ground. A first connector 850 is disposed at a distal end of the conductive path and a second connector 860 is disposed at a proximal end of the conductive path. "Flag"-type probes are spaced apart from one another a predetermined distance D along the conductive path such that a length between each of the first connector 850 and second connector 860 to a respective adjacent probe is approximately half of the predetermined distance D between adjacent probes. This spacing of each of the first connector 850 and second connector 860 allows connection of multiple strands of flags while maintaining the predetermined distance D between adjacent probes.

Figure 7C:
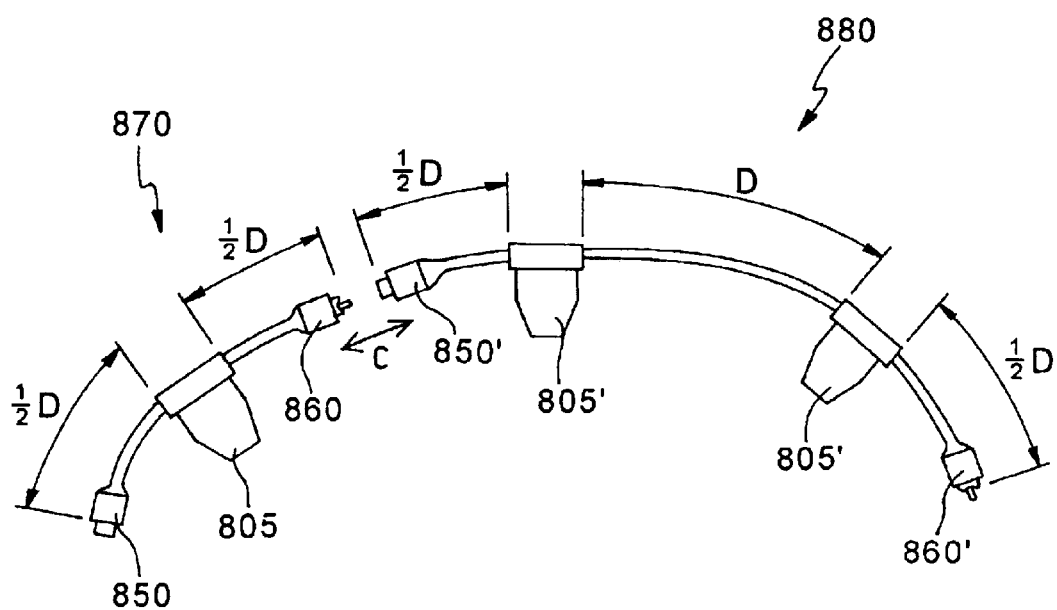
Figure 8:
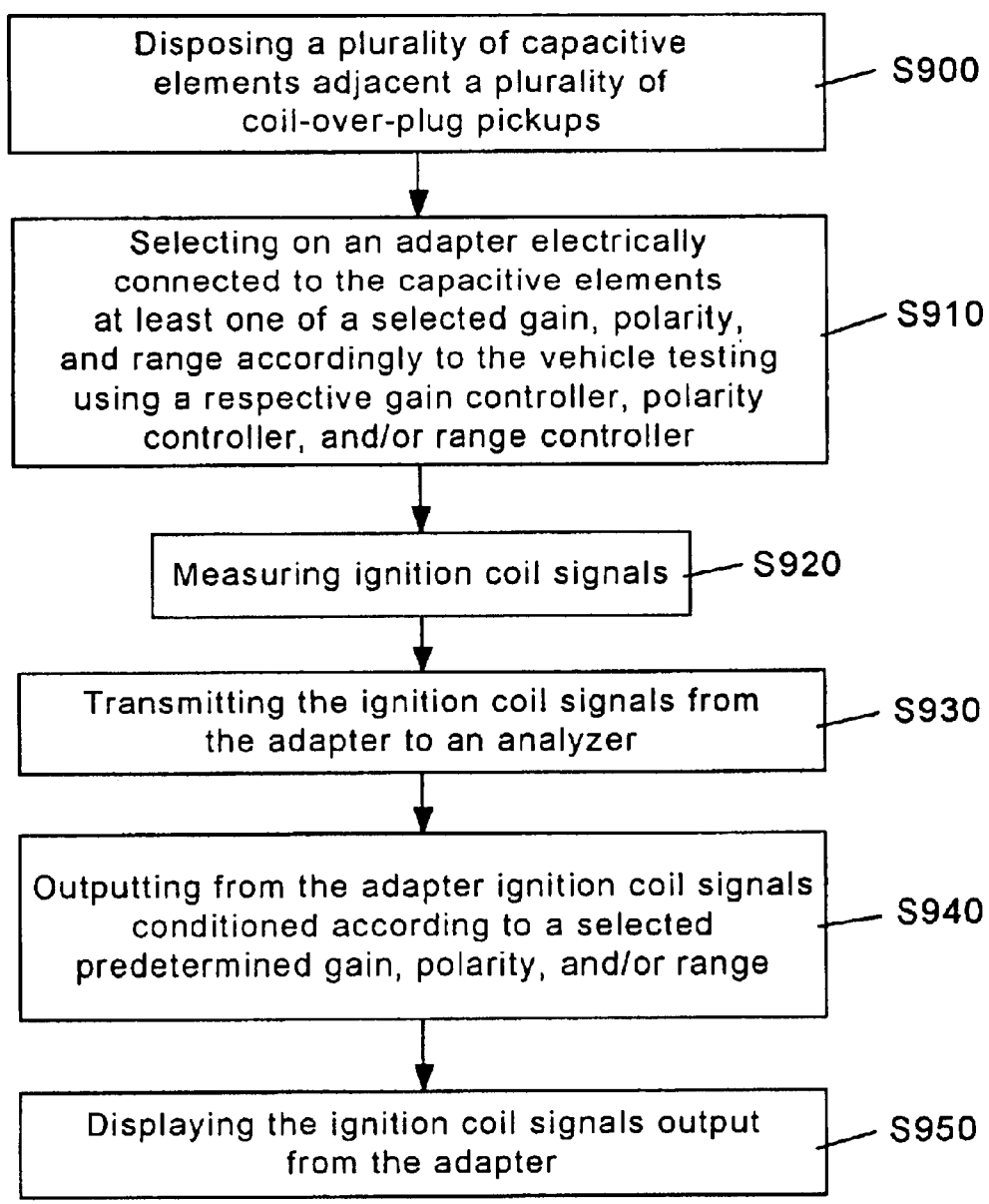
FIG. 8 depicts various steps carried out according to the invention.

As shown in FIG. 7c, a strand 870 having one flag probe 805 is connected a strand 880 having two flag probes 805' as indicated by the arrow C. In other words, second connector 860 of strand 870 detachably engages the first connector 850' of strand 880. Connection of strand 870 and strand 880 yields a three flag probe strand wherein the stated relationship between probes 805, 805' and connectors 850, 850', 860, 860' is maintained. Thereby, the flag probes are spaced apart from one another a predetermined distance D along the conductive path. The distance between flag 805 of strand 870 and flag 805' of strand 880 is D, that is, (½D+½D), as connected. Likewise, the distance between flags 805' of strand 880 is also D. In one embodiment, this distance corresponds to the distance between cylinders on an engine having an ignition coil over or near each plug, although longer distances D' may be advantageously employed to provide additional flexibility in placement of the flags, such as around or between engine components. The connected strand depicted in FIG. 7c may advantageously be used, in conjunction with another strand of three flags as shown in FIG. 4, to sense signals from a six-cylinder engine. Further, another strand having one flag could be attached to either of first connector 850 of strand 870 or second connector 860' of strand 880 to create a four flag strand for use in testing of an eight-cylinder engine.

Each embodiment of capacitive probe is implemented by positioning the elongated flexible bar above or adjacent the coils, or by positioning the flags within gaps between coil winding and core. These capacitive pickups establish, functionally, one plate of a capacitor to which the coil ignition waveform is capacitively coupled. Generally, the "stick" pickup, elongated flexible capacitive bar 750, is positioned adjacent multiple coils to pick up and conduct multiple ignition waveforms. Alternatively, multiple flags 805 may be connected or placed adjacent corresponding coils so as to pick up the ignition waveforms.

Figure 9:
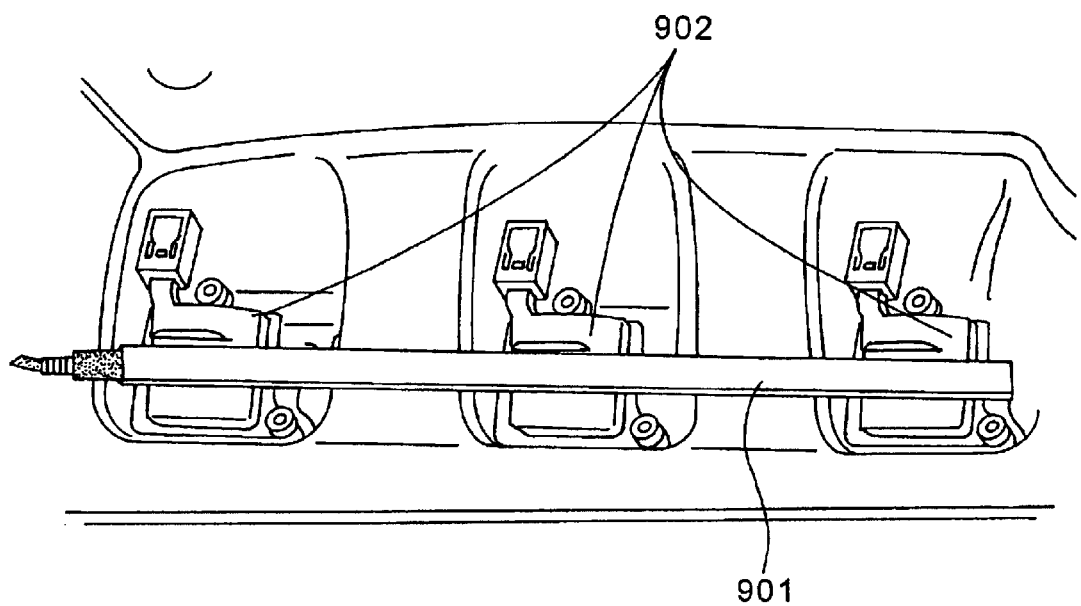
FIG. 9 shows an example of disposing a capacitive element adjacent a plurality of coil-over plug ignition coils.

In a method according to the invention, a plurality of capacitive elements, in the form of "sticks" 500 or "flags" 510 as discussed above, are disposed adjacent a plurality of coil-over-plug or coil-near-plug ignition coils 520 to simultaneously develop a signal corresponding to the ignition waveform of all six coil-plug pairs (i.e., for the illustrated six-cylinder engines). This step, S900 is depicted in FIG. 9, where a "stick" capacitive element 901 is placed across a housing covering three coil-on plug ignition coils 902.

Step S910 includes selecting, on an adapter 530 electrically connected to the capacitive elements 500, 510, a predetermined gain, polarity, and/or range according to a vehicle tested. The predetermined values are used as an initial starting point for measurement of the ignition coil waveform and correspond to particular vehicles, engine types or classes, pickup types, pickup orientation, and engine analyzer. Additionally, the capacitive elements 500, 510 are directional. In other words, if the side of the capacitive element having the ground conductive layer (e.g., side "B") is placed adjacent a coil, the ground conductive layer and dielectric attenuate the signal measured by the conductive layer used to measure the ignition coil signals. On the other hand, if the other side of the capacitive element having the conductive layer used to measure the ignition coil signals (e.g., side "A") is placed adjacent a coil the signal measured is not attenuated as in the previous example.

To illustrate S910, if "stick" pickup 500 is used to measure waveforms on a Ford 4.6L or 5.4L SOHC V8, using a Sun machine, the stick 500 should be placed with a conductive layer serving as the ground layer or shielding layer adjacent the coil. In this configuration, adapter 530 should be set in the HIGH range with a gain setting of 4. If on the other hand, a flag 510 is used, the range switch should be set in a LOW position and the gain should be set to 3. As an illustration of the variability of the required settings, and hence the need for the adapter of the present invention, the range switch needs to be set at HIGH and the gain settings should be set at 6.5 and 4, respectively, for sticks 500 and flags 510 of the above example when using a Sun SST1500 system. Additionally, the stick 500 and flag 510 pickups are oriented with a signal receiving layer disposed adjacent coils 520, instead of the ground or shielding layer. Thus, adapter 530 is able to compensate for a variety of engine types and ignition configurations.

Next, in S920, the ignition coil signals are measured by capacitive elements 500 or 510 and are transmitted to adapter 530 in step S930. The adapter 530 conditions the ignition coil signals in accord with the predetermined parameters selected in step S910. Then, the conditioned signals are output from adapter 530 in step S940 and sent to a display for technician analysis and/or to an engine analyzer or computer 605, such as a Sun SG, a Sun machine version 4.0, a Snap-On Counselor II or III, or a Sun SST1500.

Figure 10A:
FIGS. 10a and 10b show, respectively, a "parade" secondary waveform pattern display and a "raster" secondary waveform pattern display.
Figure 10B:
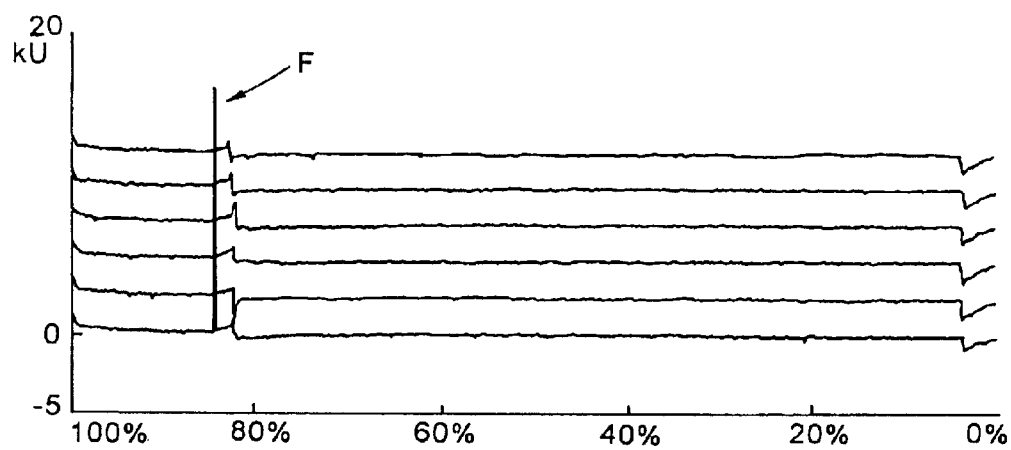

Finally, in step S950, the conditioned ignition coil signals output from adapter 530 are displayed to enable a technician to visually analyze the ingition waveforms simultaneously, in select groups, or individually. The method of displaying ignition coil waveforms includes simultaneously displaying a "parade" pattern of all cylinders, as shown in FIG. 10a. In the parade pattern, the waveform being displayed includes a sequential display of the waveforms of each cylinder and represents a complete cycle of the engine. Alternatively, as shown in FIG. 10b, the method of displaying ignition coil waveforms includes a simultaneous display of horizontal waveforms, or "raster" pattern of all cylinders, wherein the waveform for each coil is time sequenced and independently displayed above one another. FIG. 10b illustrates, specifically, an instance wherein the raster pattern is shifted from the left indicating that the gain may be set too high. To solve this problem, the gain of adapter 530 may be decreased until the firing lines F display correctly at the left side of the screen. An ignition coil waveform of a single cylinder or a raster pattern of at least two cylinders may also be displayed.

Alternatively, the method of the present invention also could include transmission of the ignition coil signals from the adapter 530 to an engine analyzer 605. The engine analyzer 605 may display the conditioned ignition coil signals directly, without any modification, or the engine analyzer 605 may perform additional signal modification as necessary for a particular application prior to display. For example, the signal may be subjected to various digital signal processing techniques, including but not limited to wave-smoothing algorithms, to facilitate analysis by either the technician or the engine analyzer 530. Thus, the signals ultimately displayed are not necessarily limited to those signals output from the adapter 530.

Figure 11A:
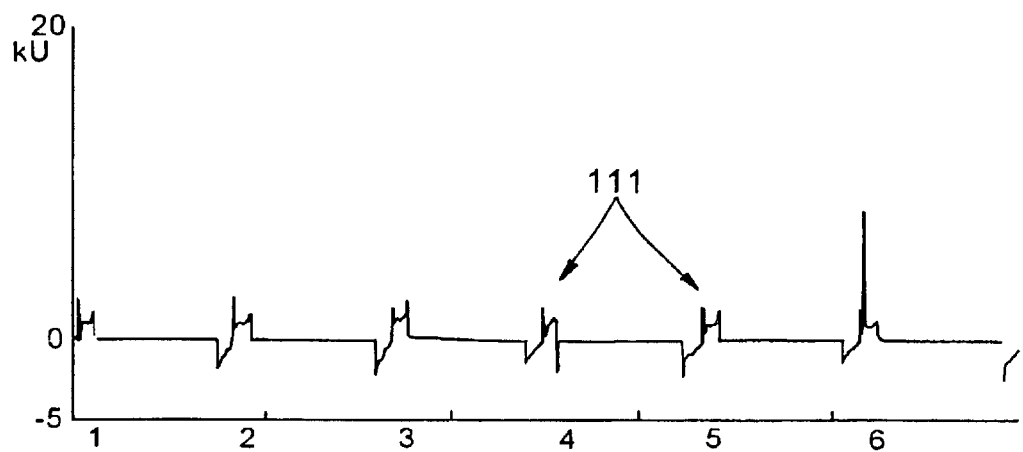
FIGS. 11a and 11b depict problematic secondary waveform traces.
Figure 11B:
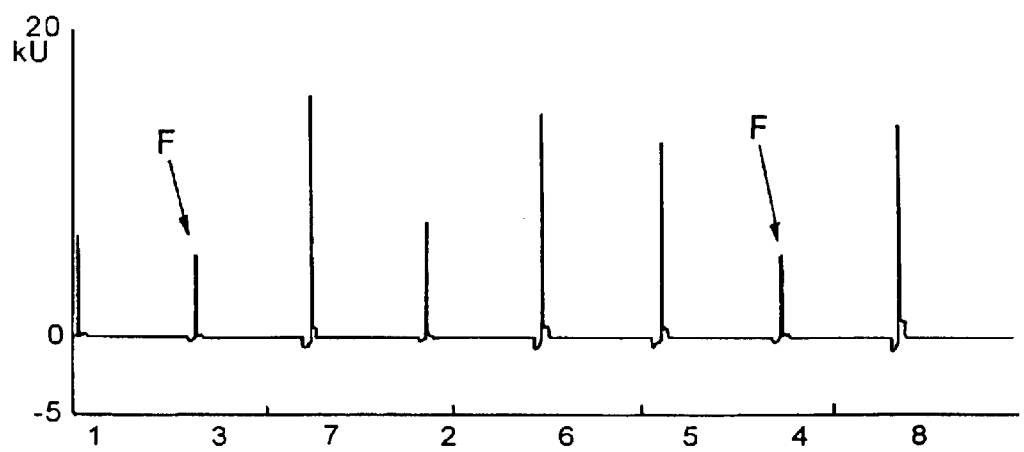

Further, the method is not limited to display of the ignition coil signals output by the adapter 530 or modified by the engine analyzer or computer 605. Depending on the displayed signals, a technician, or the computer, may adjust the predetermined gain, polarity, and/or range used as an initial starting point for signal measurement. For example, FIG. 11a shows a parade signal pattern with missing firing lines M. Viewed in real time, the firing lines may disappear intermittently, especially when the engine speed is changed. To resolve this problem, a technician selects a "raster" display, as shown generally in FIG. 10b, and adjusts the gain until all firing lines display on the left side of the screen. Another example is illustrated in FIG. 11b, showing a "parade" pattern wherein the firing lines F are small on some cylinders, namely cylinders 1–4 of an eight-cylinder vehicle. To resolve this problem, a technician checks all of the ignition pickups, noting in particular the orientation of the pickups relative to the ignition coils, such as the secondary coils. As noted above, the capacitive elements 500, 510, or pickups, are directional and have one conductive layer serving as the ground layer or shielding layer and another conductive layer serving to measure ignition coil signals. The pickups must contact each coil in the same place for consistent test results. Additionally, since after-market coils may exhibit stronger or weaker signals than OEM (original equipment manufacture) coils due to the location of the windings inside the coil, the technician must take this factor into account. Thus, the technician may have to adjust the gain settings depending on the exact location of the pickup and the type of coils (OEM vs. non-OEM).

In the previous descriptions, numerous specific details are set forth, such as specific materials, structures, processes, etc., in order to provide a thorough understanding of the present invention. However, as one having ordinary skill in the art would recognize, the present invention can be practiced without resorting to the details specifically set forth. In other instances, well known processing structures have not been described in detail in order not to unnecessarily obscure the present invention.

Only several embodiment of the invention are shown to illustrate its versatility as shown and described in the present disclosure. It is to be understood that the invention is capable of use in various other combinations and environments and is capable of changes or modifications within the scope of the inventive concept as expressed herein. Moreover, although illustrative examples of the method of the present invention were discussed, the present invention is not limited by the examples provided herein and additional variations of the invention are embraced by the claims appended hereto.

What is claimed:

1. A coil-over-plug testing adapter system for use in combination with an engine analyzer, comprising:

a capacitive pickup probe comprising a substantially planar first conductive layer and a substantially planar second conductive layer separated by a dielectric layer adapted to be placed over a coil-over-plug or coil-near-plug ignition assembly under test;

an input port arranged to receive an ignition signal provided by the capacitive pickup probe when placed over a coil-over-plug or coil-near-plug ignition assembly under test;

a variable gain controller configured to selectively modify said ignition signal received at the input port by at least one of amplification and attenuation to facilitate display of said ignition signal received from the tested coil-over-plug or coil-near-plug ignition assembly;

a trigger pickup arranged to provide a timing signal from the coil-over-plug or coil-near-plug assembly to the adapter; and an output port arranged to output the signal modified by the gain controller and timing signal to an input to an engine analyzer.

2. A coil-over-plug testing adapter system according to claim 1, further comprising a range controller to control a range of said gain controller.

3. A coil-over-plug testing adapter system according to claim 1, further comprising a polarity controller arranged to adjust a polarity of the signal output by the adapter.

4. A coil-over-plug testing adapter system according to claim 1, including battery leads connectable to terminals of a vehicle battery to supply electrical power to the adapter system.

5. A coil-over-plug testing adapter system according to claim 1, including a power source comprising a battery housed within the adapter.

6. A coil-over-plug testing adapter system according to claim 1, wherein the capacitive ignition coil probes are substantially planar and are configured for placement adjacent to and contacting a substantially planar surface of a coil-over-plug or coil-near-plug ignition assembly under test.

7. A coil-over-plug testing adapter system according to claim 1, in which the capacitive pickup probe comprises a plurality of capacitive ignition coil probes, wherein each of the capacitive ignition coil probes comprises a substantially planar first conductive layer and a substantially planar second conductive layer separated by a dielectric layer.

8. A coil-over-plug testing adapter system according to claim 7, wherein the capacitive ignition coil probes comprise a plurality of modular probes wired in series.

9. A coil-over-plug testing adapter system according to claim 7, wherein the capacitive ignition coil probe is an elongated probe having a length greater than a width thereof.

10. A coil-over-plug testing adapter system, for use in combination with an engine analyzer, comprising:

a plurality of capacitive pickup probes;

an input port arranged to receive an ignition signal provided by the capacitive pickup probe when placed in proximity to a coil-over-plug or coil-near-plug ignition assembly under test;

a variable gain controller configured to selectively modify said ignition signal received at the input port by at least one of amplification and attenuation to facilitate display of said ignition signal received from the tested coil-over-plug or coil-near-plug ignition assembly;

a trigger pickup arranged to provide a timing signal from the coil-over-plug or coil-near-plug assembly to the adapter; and an output port arranged to output the signal modified by the gain controller and timing signal to an input to an engine analyzer, wherein the plurality of capacitive probes have electrically conductive connectors at a distal end and proximal end thereof.

11. A coil-over-plug testing adapter system according to claim 10, wherein wires extending from the capacitive ignition probes and bearing the connectors are approximately one-half the length of wires disposed between adjacent probes.

* * * * *